(12) United States Patent
Zeighami et al.

(10) Patent No.: US 8,203,837 B2
(45) Date of Patent: Jun. 19, 2012

(54) COOLING SYSTEM

(75) Inventors: Roy Zeighami, McKinney, TX (US); Robert Lankston, Roseville, CA (US)

(73) Assignee: Hewlett-Packard Developmet Company, L.P., Houston, TX (US)

( * ) Notice: Subject to any disclaimer, the term of this patent is extended or adjusted under 35 U.S.C. 154(b) by 169 days.

(21) Appl. No.: 12/751,189

(22) Filed: Mar. 31, 2010

(65) Prior Publication Data

US 2011/0242755 A1  Oct. 6, 2011

(51) Int. Cl.
*H05K 7/20* (2006.01)
(52) U.S. Cl. ......... 361/679.46; 361/679.47; 361/679.48; 361/690; 361/695; 165/104.19; 165/104.21; 165/104.33; 454/184
(58) Field of Classification Search ............... 361/679.46–679.53, 688, 689, 361/690–702, 715–727; 165/104.19, 104.21, 165/104.33, 104.34, 80.2–80.5, 185; 62/259.2; 454/184, 359; 312/223.2, 223.3, 236; 73/726
See application file for complete search history.

(56) References Cited

U.S. PATENT DOCUMENTS

| | | | |
|---|---|---|---|
| 5,718,628 A * | 2/1998 | Nakazato et al. | 454/184 |
| 6,412,292 B2 * | 7/2002 | Spinazzola et al. | 62/89 |
| 6,414,828 B1 * | 7/2002 | Zimmerman et al. | 361/1 |
| 6,694,759 B1 * | 2/2004 | Bash et al. | 62/180 |
| 6,957,544 B2 * | 10/2005 | Dobbs et al. | 62/178 |
| 7,051,946 B2 * | 5/2006 | Bash et al. | 236/49.3 |
| 7,214,131 B2 * | 5/2007 | Malone | 454/184 |
| 7,330,350 B2 * | 2/2008 | Hellriegel et al. | 361/679.48 |
| 7,500,911 B2 * | 3/2009 | Johnson et al. | 454/184 |
| 7,522,418 B2 * | 4/2009 | Ishimine | 361/699 |
| 7,542,287 B2 * | 6/2009 | Lewis et al. | 361/695 |
| 7,568,360 B1 * | 8/2009 | Bash et al. | 62/186 |
| 7,604,535 B2 * | 10/2009 | Germagian et al. | 454/184 |
| 7,643,291 B2 * | 1/2010 | Mallia et al. | 361/695 |
| 7,684,193 B2 * | 3/2010 | Fink et al. | 361/695 |
| 7,752,858 B2 * | 7/2010 | Johnson et al. | 62/186 |
| 7,861,596 B2 * | 1/2011 | Bean, Jr. | 73/726 |
| 7,903,407 B2 * | 3/2011 | Matsushima et al. | 361/695 |
| 7,961,463 B2 * | 6/2011 | Belady et al. | 361/695 |
| 2004/0099747 A1 * | 5/2004 | Johnson et al. | 236/49.3 |
| 2005/0011208 A1 * | 1/2005 | Dobbs et al. | 62/178 |
| 2005/0241810 A1 * | 11/2005 | Malone et al. | 165/122 |
| 2005/0270738 A1 * | 12/2005 | Hellriegel et al. | 361/687 |
| 2007/0074525 A1 * | 4/2007 | Vinson et al. | 62/259.2 |
| 2007/0097636 A1 * | 5/2007 | Johnson et al. | 361/695 |
| 2008/0098763 A1 * | 5/2008 | Yamaoka | 62/259.2 |
| 2008/0185446 A1 * | 8/2008 | Tozer | 236/49.4 |
| 2009/0061756 A1 * | 3/2009 | Germagian | 454/184 |
| 2009/0168345 A1 * | 7/2009 | Martini | 361/691 |
| 2010/0064714 A1 * | 3/2010 | Tashiro | 62/259.2 |

(Continued)

FOREIGN PATENT DOCUMENTS

GB  2450098 A  *  6/2007

(Continued)

*Primary Examiner* — Michail V Datskovskiy

(57) ABSTRACT

According to an embodiment of the present invention, there is provided a system for cooling. The system comprises an equipment rack installable in a facility and for accommodating a plurality of electronic equipment. The system further comprises an exhaust duct into which the electronic equipment, when installed in the rack, exhausts gas drawn from a first section of a facility. The system further comprises a gas flow meter for measuring gas flow in the exhaust duct, and a controller for generating control signals to control, based on the measured gas flow, the output of a cooling unit arranged to provide cooled gas to the first section of the facility.

15 Claims, 4 Drawing Sheets

U.S. PATENT DOCUMENTS

2010/0139908 A1* 6/2010 Slessman .................. 165/279
2010/0149754 A1* 6/2010 Chapel et al. ............. 361/696
2010/0216388 A1* 8/2010 Tresh et al. ............... 454/184
2010/0252233 A1* 10/2010 Absalom ..................... 165/57

FOREIGN PATENT DOCUMENTS

JP         406013775 A  *  1/1994
WO    WO2010/065903 A1 *  6/2010

* cited by examiner

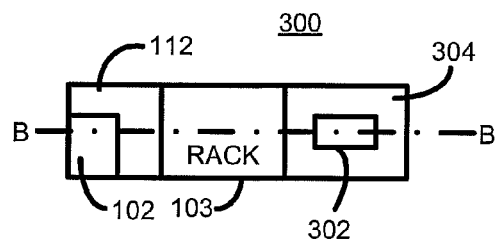
FIGURE 3a
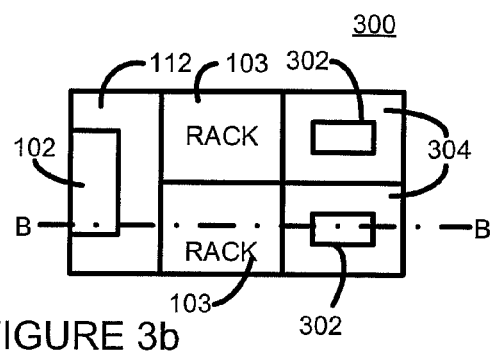
FIGURE 3b
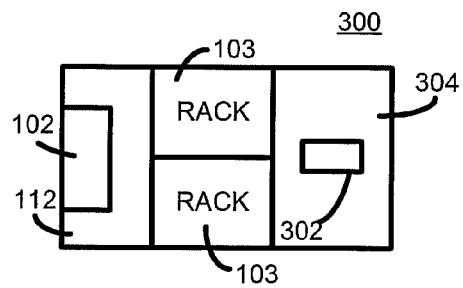
FIGURE 3c
FIGURE 3d
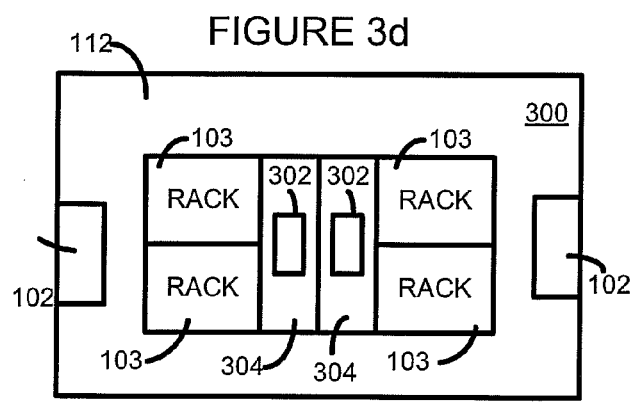

COOLING SYSTEM

BACKGROUND

Purpose built facilities housing multiple electronic devices are becoming increasingly popular. One common example of such a facility is a datacenter. A datacenter is a building or structure housing multiple electronic devices often including, for example, computing, communication, storage, cooling and network devices. Since many such devices generate heat during their operation, and further since data centers are generally densely populated with such devices, cooling the devices within a datacenter becomes critical to ensure that correct device operating temperatures are maintained.

BRIEF DESCRIPTION

Embodiments of the invention will now be described, by way of non-limiting example only, with reference to the accompanying drawings, in which.

Figure 4:
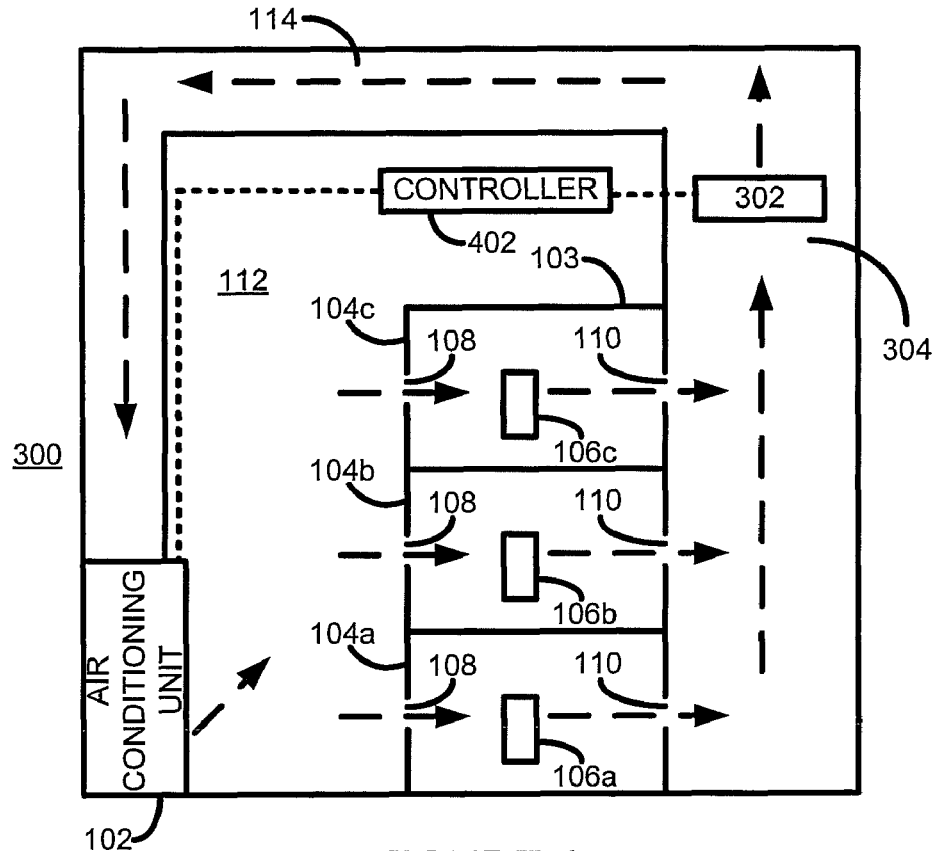
Figure 5:
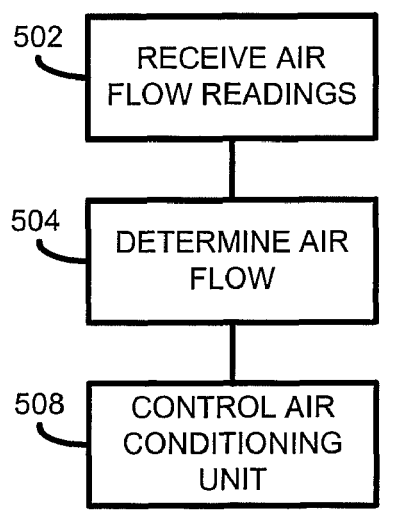
Figure 6:
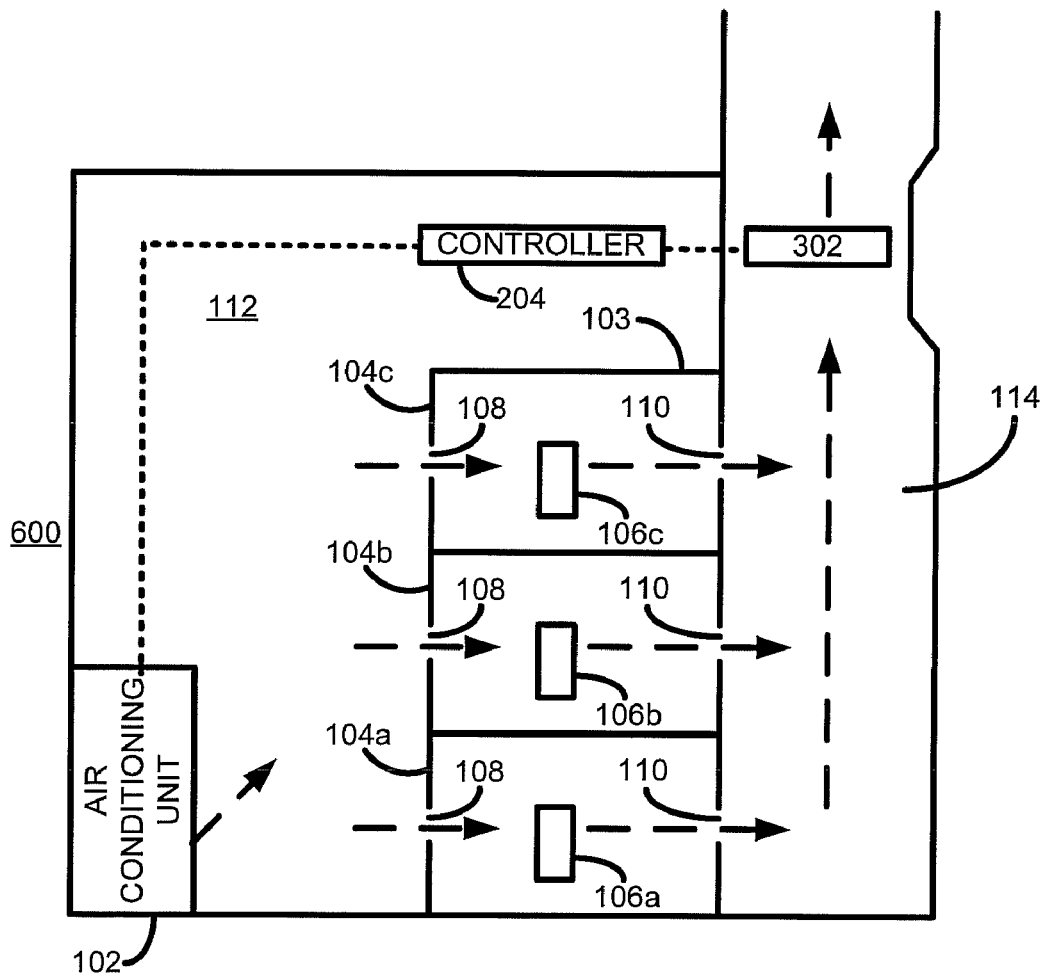

FIGS. 3a, 3b, 3c, and 3d are simplified illustrations showing a plan view of various embodiments of a facility;

FIG. 4 is a simplified illustration showing a section view of a facility shown in FIG. 3;

FIG. 5 is a flow diagram outlining an exemplary method according to an embodiment of the present invention; and FIG. 6 is a simplified illustration showing a section view of a facility according to a further embodiment of the present invention.

DETAILED DESCRIPTION

Many data centers use cooled air produced from air cooling or air conditioning units (often referred to as computer room air conditioning or CRAC units) as their primary cooling mechanism. Many such data centers employ simple cooling schemes such as fixed airflow schemes that use CRAC units configured to produce a fixed amount of cooled airflow to the data center. To ensure adequate cooling of the devices in a data center fixed airflow schemes must substantially overprovision cooled air to cater for worst case scenarios when some or all of the devices in the data center are under high load or are producing high amounts of heat. Not surprisingly, producing more cooled air than is required results in such systems being somewhat energy inefficient and this can lead to increased operation costs.

Improvements over fixed airflow schemes add a level of control to the CRAC units. For example, it is generally known to control the temperature of cooled airflow output by a CRAC unit within a facility such as a datacenter. Some data center cooling systems, for example, use temperature sensors within each equipment device in the data center and control air conditioning units within the facility based on the temperatures reported by the sensors. Other systems monitor, for example, the processing load of microprocessors within devices and control the air conditioning units based on the monitored microprocessor loads.

However, given the generally quantity of devices in such facilities, monitoring characteristics of individual devices, such as component temperature or device processor load, is generally complex in nature and may be difficult to implement. Consequently, the cost of such systems may be elevated.

Figure 1:
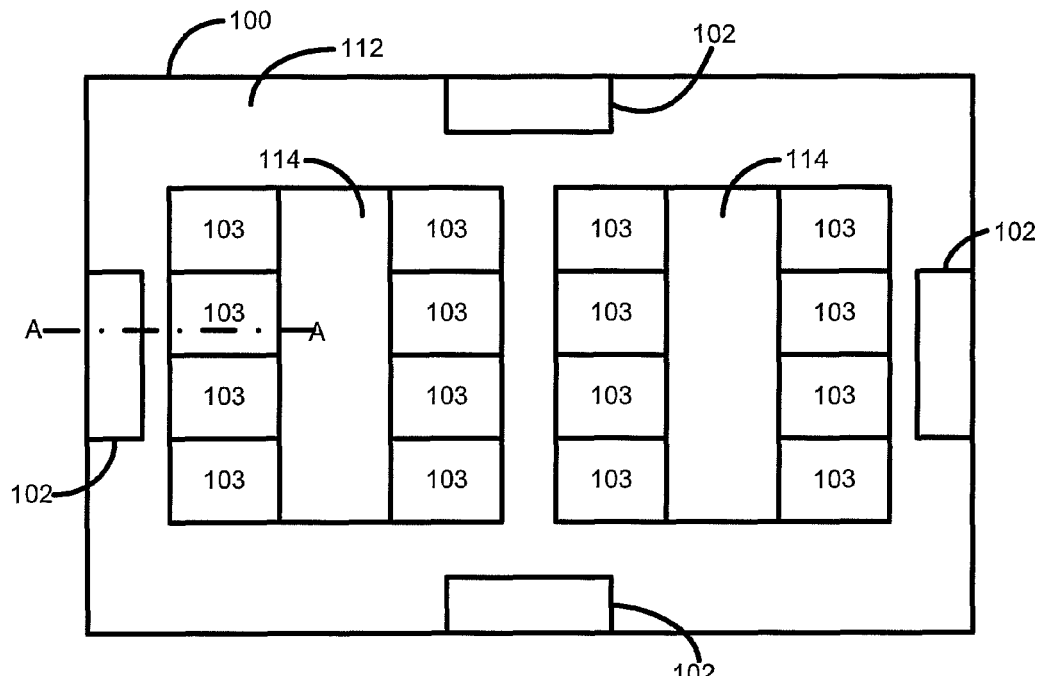
FIG. 1 is a simplified illustration showing a plan view of a facility.

Referring now to FIG. 1 there is shown a simplified plan view of a facility 100 such as a datacenter.

The facility 100 houses a number of racks 103 of electronic devices (not shown) such as computing, network, communication, and storage devices. Racks are arranged next to each other into rows of racks, and pairs of rows of racks are arranged back-to-back with a void separating the pairs of rows of racks. The ends of rows are completed with a panel structure to create a first facility section 112 and one or more second facility sections 114. The facility is arranged such that the first facility section 112 is substantially fluidly segregated from second facility sections 114 in such a way that air within first section 112 and second sections 114 are not able to freely mix, as will become more apparent below. Mixing typically only occurs by air being drawn from the first section 112 and exhausted into the second section 114 through devices installed in the racks 103. In a datacenter context the first section 112 and second sections 114 may be referred to respectively as a cold aisle and a hot aisle. In the present example the segregation is achieved primarily by providing a physical boundary between the sections 112 and 114.

A number of air cooling or air conditioning units 102 provide cooled air at a predetermined fixed temperature and at a predetermined fixed flow rate to the first section 112. In the present example the air conditioning unit 102 conditions warmer air from the second section 114 and outputs cooler air into the first section 112.

Embodiments of the present invention will now be described below with reference to the accompanying drawings. In the drawings dotted lines are used generally to illustrate control signals, and dashed lines are used to illustrate fluid flow such as gas or air flow. Like reference numerals between the drawings indicate similar, but not necessarily identical, elements.

Figure 2:
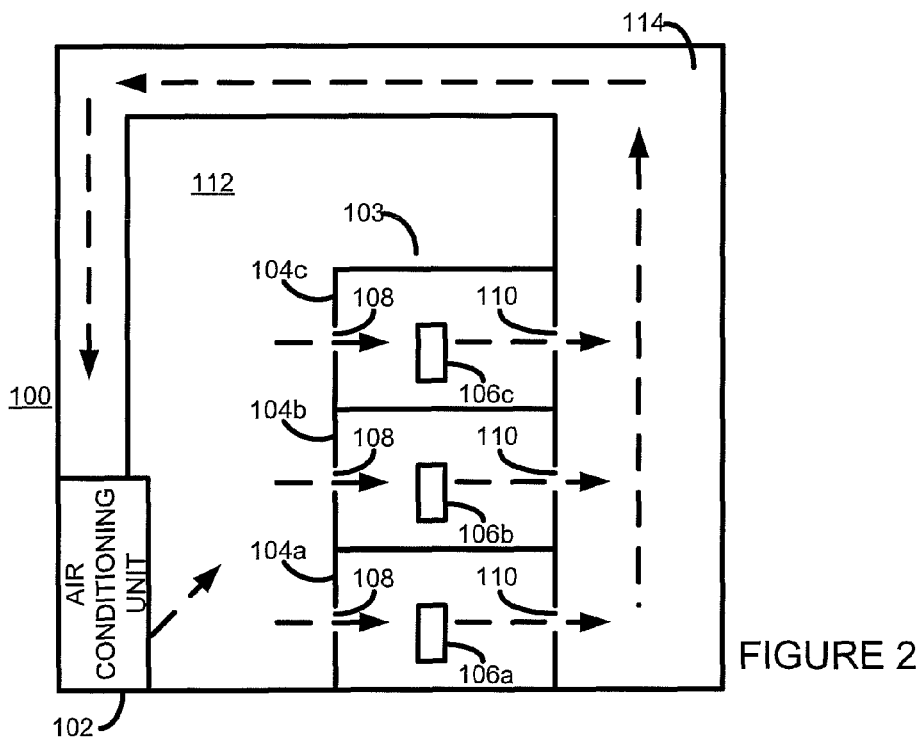
FIG. 2 is a simplified illustration showing a section view of the facility shown in FIG. 1.

FIG. 2 shows a simplified sectional view across the section A-A of FIG. 1. A number of devices 104a, 104b, and 104c are arranged in an equipment rack 103. The devices 104 may be, for example, electronic devices such as computing devices, and each device may generate a variable amount of heat during operation. Each device 104a, 104b, and 104c comprises a ventilator, respectively 106a, 106b, 106c, to draw air from the first section 112 through an inlet vent 108, through the device, and to exhaust the air through an exhaust vent 110 into the second section 114. The air drawn through each device 104 is heated by the device 104 as the air cools the device 104. The exhausted air is therefore generally warmer than the air in the first section 112.

Each ventilator 106a, 106b, 106c, may be for example, a mechanical fan, the speed of which is varied automatically by their respective devices 104a, 104b, 104c, based on the measured temperature of the device or of one or more components therein.

By having the air conditioning unit 102 provide a fixed flow of cooled air at a predetermined temperature may lead to two general situations arising.

Firstly, if an excess flow of cooled air is supplied adequate cooling is provided to each of the devices 104, although energy is wasted in generating an excess amount of cooled air. With energy efficiency becoming an increasingly important aspect, such an approach is somewhat undesirable.

Secondly, if an inadequate flow of cooled air is provided there is a risk that warm air from the second section 114 gets drawn in through an exhaust vent 110 of a device, or through unoccupied racks spaces, if the ventilator of one or more of the other devices is providing a high flow of air to cool its respective device.

For example, if the device 104a is under a high load and is generating a large amount of heat, the speed of the ventilator 106a will be increased by the device 104a in an attempt to cool the device. However, if the air flow generated by the ventilator 106a is greater than the air flow provided by the air conditioning unit 102 this will create a negative pressure in the first section 112 compared to the pressure in the second section. Accordingly, this can cause a back-flow of warmer air from the second section 114 into the first section 112 through one or more of the devices 104. Such an effect is undesirable since the influx of warmer air into a device may lead to sub-optimum cooling and may lead to overheating problems.

Referring now to FIG. 3, there are shown simplified plan views of a number of example facility 300 configurations according to embodiments of the present invention.

FIG. 3a shows a modified hot aisle arrangement according to an embodiment of the present invention comprising a first section 112 comprising an air conditioning unit 102, a rack 103 for housing a number of devices. The air conditioning unit 102 provides cool air primarily for the devices in the rack 103. Warmed air is exhausted by the devices in the rack 103 into a rack chimney, flue, or duct 304. The rack chimney 304 contains or confines the exhaust air from each of the devices 104 in the single rack 103. An air flow meter 302 is located in the rack chimney, the purpose of which is described below.

FIG. 3b shows a further example facility configuration in which a pair of racks 103 is provided, each with an individual rack chimney 304. Each rack chimney 304 contains air exhausted by devices in each of their respective racks. A single air conditioning unit 102 provides cool air primarily for the devices in the pair of racks 103.

FIG. 3c shows a further example facility configuration in which a pair of racks 103 is provided. The pair of racks 103 share a single chimney 304, such that air exhausted from devices in either of the racks 103 is contained in the chimney 304. A single air conditioning unit 102 provides cool air primarily for the devices in the pair of racks 103.

FIG. 3d shows a further example facility configuration in which two pairs of racks 103 are arranged back-to-back, which a single chimney being shared by the four racks 103. Two air conditioning units are provided, with the left hand air conditioning unit 102 providing cool air primarily for the left hand racks 103, and the right hand air conditioning unit 102 providing cool air primarily for the right hand racks 103.

Further embodiments provide for other facility configurations.

In some embodiments the chimney or chimneys 304 vent into a warm air return duct, such as a hot aisle 114. In further embodiments the chimney 304 vents outside of the facility, for example, into the atmosphere.

Referring now to FIG. 4, there is shown a simplified section view of the facility shown in FIG. 3a along the section B-B.

The facility 300 comprises devices 104a, 104b, and 104c, which are arranged in an equipment rack 103. As shown in FIG. 3a, air exhausted from the exhaust vents of devices 104 is exhausted into a rack chimney 304. The chimney 304 vents into a warm air return duct 114, where warm air is returned to the air conditioning unit 102.

In the present example, a volumetric flow meter 302 is located in the rack chimney or duct 304 to measure the volumetric flow of air at a specific point in the chimney 304. In the present example, the chimney 304 is arranged such that warm air exhausted there into rises. The meter 302 is located above the level of the devices 104 such that an accurate measure of the volume of air flow at that location in the chimney 304 may be obtained. In one embodiment the meter 302 may be suitably located in a narrowed portion of the chimney 304. By placing the meter 302 in a narrowed portion of the chimney 304 causes an increase in airspeed which may lead to an increase in the accuracy of the measurements made by the meter 302, depending on the kind of meter 302 used.

The meter 302 may be any suitable flow meter, such as a flow metering turbine or a venturi tube. In one embodiment one or more air velocity measuring devices may be used. If an air speed monitoring device is used the section area of the chimney 304 at the location of the meter 302 may be used in conjunction with the measured air speed to enable a volumetric air flow to be calculated.

The meter 302 generates signals indicative of the measured air flow. The control signals are received (502) at a controller 402, for example, through a wire-line or wire-less connection. From the received control signals the controller 402 determines (504) the volumetric air flow in the chimney 304 at the location of the meter 302. The controller 402 then determines (506) the volumetric air flow over a pre-determined preceding period. The pre-determined preceding period may be any suitable period, for example, such as 1 second, 10 seconds, 1 minute, 10 minutes. The period length may be varied based on the frequency at which devices in the facility vary the amount of heat generated during their operation. The controller 402 then sends (508) control signals to the control the volume of air output by the air conditioning unit 102. In one embodiment the controller 402 may be integral with the air conditioning unit 102.

For example, if during period $P_1$ the controller 402 determines that the average volumetric air flow measured by the meter 302 was 100 cc/s, the controller sends control signals to the air conditioning unit 102 to cause the air conditioning unit 102 to output substantially 100 cc/s of cooled air. This may be achieved, for example, by setting the speed of a fan in the air conditioning unit to a speed which will cause the air conditioning unit to output the required amount of air. The correlations of fan speed and volumetric flow output is typically available in the air condition unit documentation.

The aim is thus to substantially match the air flow output of the air conditioning unit 102 with the air flow measured in the rack chimney 304. As previously mentioned, if too low a volume of air is output by the air conditioning unit 102 this may cause a negative pressure and backflow problems.

In one embodiment, the controller 402 adds a predetermined offset amount to he measured airflow in the chimney 304. The offset amount causes the air conditioning unit 102 to output a higher volume of air than that measured in the rack chimney 304, to ensure a positive air pressure is maintained in the first section 112 compared to the chimney 304. Maintaining a positive air pressure helps further reduce the previously described problems related to air backflow.

In other embodiments, such as the embodiment shown in FIG. 3b, the controller 402 determines control signals to be sent to the air conditioning unit 102 based on the volumetric flow detected in each of the flow meters 302 in each of the pair of chimneys 304. For example, in one embodiment the air conditioning unit 102 may be controlled based on the highest measured flow rate. In further embodiments the air conditioning unit 102 may be controlled based on the average of the measured flow rates.

In embodiments where there are multiple air conditioning units, such as the embodiment shown in FIG. 3d, one or more air conditioning unit controllers may be used to control the different air conditioning units. For example, in the embodiment shown in FIG. 3d, the left hand air conditioning unit may be controlled based on air flow measurements made by the left hand air flow meter 302 in the left hand chimney 304, and the right hand air conditioning unit 102 may be controlled based on air flow measurements made by the right hand air flow meter 302 in the right hand chimney 304. In further embodiments having multiple air conditioning units and multiple flow meters, appropriate combination of the air flow measurements by the controller 402 may be performed. Appropriate combination may include, for example, suitable mathematical, computational, and logical combination.

Referring now to FIG. 6 is shown an additional embodiment in which the rack chimney 114 vents into the open atmosphere. As described above, the controller 204 controls the air conditioning unit 102 based on the air flow measured in the chimney 302.

Advantageously, the above described embodiments help avoid over production of cooled air, and hence reduce energy wasted by over provisioning cool air. At the same time, the above described embodiments help ensure that adequate cooling is provided to the devices in the facility. This is achieved in a simple manner that does not require individual monitoring of characteristics, such as temperature or processor load, of individual devices. Use of a rack chimney enables accurate volumetric flow rate measurements to be made at the rack level, and is achieved in a way that is independent of the devices within each rack.

Those skilled in the art will appreciate that reference herein to air is not limited thereto and is intended to encompass any appropriate gas or fluid.

Although the above description is made primarily to datacenter facilities, it will be appreciated the other embodiments can be realized in relation to facilities other than datacenter facilities. Examples of other kinds of facilities include, for example, facilities housing mechanical devices, electro-mechanical devices, power supplies, power generation equipment, heating equipment, and the like.

It will be appreciated that embodiments of the present invention can be realized in the form of hardware, software or a combination of hardware and software. Any such software may be stored in the form of volatile or non-volatile storage such as, for example, a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape. It will be appreciated that the storage devices and storage media are embodiments of machine-readable storage that are suitable for storing a program or programs that, when executed, implement embodiments of the present invention. Accordingly, embodiments provide a program comprising code for implementing a system or method as claimed in any preceding claim and a machine readable storage storing such a program. Still further, embodiments of the present invention may be conveyed electronically via any medium such as a communication signal carried over a wired or wireless connection and embodiments suitably encompass the same.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

Although the above description makes reference primarily to air and air conditioning, it will be appreciated that the above-described embodiments are limited thereto. For example, any suitable fluids, liquids, or gasses suitable for transporting heat or thermal energy from devices 104 may be used. Illustrative, non-limiting, liquids can include water, glycol solutions, and the like. Illustrative, non-limiting, gases can include ambient or conditioned air, or similar non-condensing gases or gas mixtures.

The invention claimed is:

1. A system for cooling, comprising:
a plurality of equipment racks disposed in a facility, each equipment rack having a front, two sides, and a rear, the plurality of equipment racks arranged into rows of racks with abutting sides and pairs of rows of racks arranged back-to-back defining a second facility section separating each pair of back-to-back rows of side-by-side abutting racks, wherein the front of each rack faces a first facility section, each rack comprising:
an exhaust duct to exhaust gas drawn through the rack gas from the first facility section; and
a gas flow meter in the exhaust duct to measure gas flow; and
a controller to control, based on the measured gas flow of each gas flow meter, an output flow of a cooling unit;
wherein the system provides cooled gas to the first section of the facility.

2. The system of claim 1, wherein the controlled output flow of the cooling unit is based on a highest measured exhaust gas flow of each rack.

3. The system of claim 1, wherein the controller generates control signals to control a plurality of gas cooling units to provide cooled gas to the first section of the facility.

4. The system of claim 1, further comprising a panel structure disposed at ends of the pairs of back-to-back rows of equipment racks, wherein the first section of the facility and the exhaust duct of each rack is fluidly separated.

5. The system of claim 1, wherein each equipment rack comprises electronic equipment having a heat generating source and a variable flow ventilator, the variable flow ventilator to draw gas from the first section and to exhaust gas into the exhaust duct.

6. The system of claim 1, wherein the gas cooling unit cools air from the second facility section.

7. The system of claim 1, wherein the exhaust duct vents into open atmosphere.

8. The system of claim 1, wherein the facility is a data center, and wherein each equipment rack comprises at least one electronic device comprising at least one of: a computing device, a network device, a communication device, a power supply, and a storage device.

9. A method of cooling in a facility comprising a plurality of equipment racks, each rack having a front, two sides, a rear, and a rack exhaust duct,
wherein the plurality of equipment racks are arranged into rows of racks with abutting sides and pairs of rows of racks arranged back-to-back, defining a second section of the facility separating each pair of back-to-back rows of side-by-side abutting racks, wherein the front of each rack faces a first section of the facility, and
wherein each rack accommodates a plurality of electronic equipment and each of the plurality of electronic equipment comprises a variable flow ventilator, the method comprising:
each variable flow ventilator drawing cooled gas from the first section of the facility through each of the plurality of electronic equipment in each equipment rack and exhausting the gas to the second section of the facility through the rack exhaust duct;

determining the gas flow in each rack exhaust duct; and a controller controlling the output of a gas cooling unit providing cooled gas to the first section of the facility based on the determined gas flow in each rack exhaust duct.

10. The method of claim 9, wherein each of the plurality of equipment racks comprises a gas flow meter, wherein controlling the output of the gas cooling unit comprises controlling the gas cooling unit based on one of a highest determined gas flow and an average of the determined gas flows from the gas flow meters.

11. The method of claim 9, wherein the facility comprises a plurality of gas cooling units, and the providing cooled gas to a first section of the facility comprises controlling the plurality of gas cooling units.

12. The method of claim 9, wherein the controlling the output of a gas cooling unit is based on an average of the gas flow determined in each exhaust duct.

13. A data center comprising:

a plurality of electronic equipment disposed in at least one equipment rack, the plurality of electronic equipment comprising a variable flow ventilator, a gas inlet, and a gas outlet, the variable flow ventilator to draw gas through the gas inlet and to exhaust gas through the gas outlet;

the data center to draw gas through the plurality of electronic equipment in each rack from a first section of the data center, and to exhaust gas from the plurality of electronic equipment in the rack into an exhaust duct;

the data center further comprising:

a gas-flow measurement device located in the exhaust duct to measure the gas-flow therein; and a controller to control the gas flow of a gas conditioning unit based on the measured gas-flow, the gas conditioning unit to supply cooled air to the first section.

14. The data center of claim 13, wherein each equipment rack comprises a plurality of equipment racks, each equipment rack having a front, two sides, and a rear, the plurality of racks arranged into rows of racks with abutting sides and pairs of rows of racks arranged back-to-back defining the first section separating each pair of back-to-back rows of side-by-side abutting racks, wherein the front of each rack faces the first section.

15. The method of claim 9, wherein the controller adds a predetermined offset amount to the determined gas flow in each rack exhaust duct to ensure a positive air pressure is maintained in the first section compared to the rack exhaust duct.

* * * * *

UNITED STATES PATENT AND TRADEMARK OFFICE
CERTIFICATE OF CORRECTION

PATENT NO. : 8,203,837 B2
APPLICATION NO. : 12/751189
DATED : June 19, 2012
INVENTOR(S) : Roy Zeighami et al.

Page 1 of 1

It is certified that error appears in the above-identified patent and that said Letters Patent is hereby corrected as shown below:

On the face page, in field (73), Assignee, in column 1, line 1, delete "Developmet" and insert -- Development --, therefor.

Signed and Sealed this
Twenty-ninth Day of January, 2013

David J. Kappos
*Director of the United States Patent and Trademark Office*